(12) United States Patent
Casares

(10) Patent No.: US 9,528,886 B2
(45) Date of Patent: Dec. 27, 2016

(54) METHOD AND APPARATUS FOR DIAGNOSING A DEVICE FOR DETERMINING THE TEMPERATURE OF A COMPONENT OF AN ELECTRIC UNIT

(71) Applicant: Robert Bosch GmbH, Stuttgart (DE)

(72) Inventor: Miguel Casares, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 567 days.

(21) Appl. No.: 14/035,632

(22) Filed: Sep. 24, 2013

(65) Prior Publication Data

US 2014/0092936 A1 Apr. 3, 2014

(30) Foreign Application Priority Data

Sep. 28, 2012 (DE) .................. 10 2012 217 787

(51) Int. Cl.
*G01K 13/00* (2006.01)
*G01K 15/00* (2006.01)
*G01K 3/14* (2006.01)
*G01R 31/34* (2006.01)
*H02P 29/00* (2016.01)

(52) U.S. Cl.
CPC ............. *G01K 13/00* (2013.01); *G01K 3/14* (2013.01); *G01K 15/00* (2013.01); *G01K 2217/00* (2013.01); *G01R 31/343* (2013.01); *H02P 29/0044* (2013.01)

(58) Field of Classification Search
CPC ............ G01K 3/14; G01K 3/08; G01K 13/00; G01K 15/00; G01K 15/005; G01K 2217/00; H02P 29/0044; H02P 29/0061; H02P 29/0077; G01R 31/343; G01R 1/0458

USPC .......................... 374/152, 110, 112
See application file for complete search history.

(56) References Cited

U.S. PATENT DOCUMENTS

| | | | | |
|---|---|---|---|---|
| 2001/0035741 A1* | 11/2001 | Murakami | .......... | H01M 10/443 320/150 |
| 2003/0227756 A1* | 12/2003 | Abe | .......... | H03F 3/343 361/748 |
| 2003/0236149 A1* | 12/2003 | Gabriel | .......... | F16H 59/72 477/98 |
| 2006/0161365 A1* | 7/2006 | Tanaka | .......... | G05D 23/1935 702/99 |
| 2007/0036197 A1* | 2/2007 | Huttenlocher | .......... | G01K 15/00 374/1 |

(Continued)

FOREIGN PATENT DOCUMENTS

| DE | 102004061815 | 7/2006 |
|---|---|---|
| DE | 102005037717 | 12/2006 |

(Continued)

*Primary Examiner* — Lisa Caputo
*Assistant Examiner* — Philip Cotey
(74) *Attorney, Agent, or Firm* — Michael Best & Friedrich LLP

(57) ABSTRACT

A method, an apparatus, and an electric system for diagnosing a device (104) for determining the temperature of a component (101) of an electric unit (107) are provided. In a first step (203), a first temperature gradient (TG1) of the component (101) is ascertained. A second temperature gradient (TG2) is determined using the device (104) for determining the temperature of a component (101). In a second step (204), a difference between the first and the second temperature gradient (TG1, TG2) is ascertained.

16 Claims, 2 Drawing Sheets

(56) References Cited

U.S. PATENT DOCUMENTS

| | | | | |
|---|---|---|---|---|
| 2007/0153434 | A1* | 7/2007 | Kobayashi | H02P 29/0044 361/25 |
| 2009/0129430 | A1* | 5/2009 | Foerstner | F01P 11/16 374/1 |
| 2009/0316328 | A1* | 12/2009 | Kernwein | F02P 19/025 361/264 |
| 2011/0181217 | A1* | 7/2011 | Vollmer | G01K 7/42 318/400.21 |

FOREIGN PATENT DOCUMENTS

| | | |
|---|---|---|
| DE | 102007056559 | 5/2009 |
| DE | 102008040725 | 1/2010 |

* cited by examiner

METHOD AND APPARATUS FOR DIAGNOSING A DEVICE FOR DETERMINING THE TEMPERATURE OF A COMPONENT OF AN ELECTRIC UNIT

BACKGROUND OF THE INVENTION

The present invention relates to a method and an apparatus for diagnosing a device for determining the temperature of a component of an electric unit and an electric system.

During the operation of electric systems, it is known to monitor the temperature of individual components of the electric system. The temperature is monitored primarily to avoid overheating and thus damaging these components due to an electrical overload. It is also known from the prior art to perform diagnostics in order to monitor the functionality of such devices for determining the temperatures. To do this, for example, a second temperature measurement is performed at another point, independently of the initial measurement. The two temperatures are then compared to each other. If the comparison results in a deviation that is too large, one of the ascertained measurands is erroneous. A similar method is known from DE 10 2008 040 725 A1.

SUMMARY OF THE INVENTION

The present invention provides a simplified, universally applicable method and an apparatus for diagnosing a device for determining the temperature of a component of an electric unit.

According to the present invention, a method for diagnosing a device for determining the temperature of a component of an electric unit is provided. During the operation of the electric unit, an effective current flows through the electric unit. In a first step, a first temperature gradient of the component is ascertained as a function of the effective current flowing through the electric unit. A second temperature gradient is also determined using the device for determining the temperature of a component. The two temperature gradients are compared in a second step. In particular, a difference between the first and the second temperature gradients is ascertained.

According to the present invention, the two temperature gradients described above are thus ascertained and compared to each other for diagnosing the device for determining the temperature. The first temperature gradient is ascertained as a function of the effective current flowing through the unit. The flowing effective current is used as a physical measurand, which is proportional to the electrical and thermal loading of the electric unit. For one-phase systems, it is sufficient to observe the effective current flowing through one phase. For multiphase electric units, multiple phases are preferably factored in, in particular, if the loading of individual phases is unequal. The second temperature gradient is determined via the device for determining the temperature of a component. Thus, two independent methods are preferably provided for determining two temperature gradients. In the following second step, which constitutes the actual diagnosis, the two temperature gradients are compared. In particular, the difference between the first and the second temperature gradients is ascertained. If the difference between these two ascertained temperature gradients is smaller than a predefinable difference value, the temperature detection using the device for determining the temperature of a component functions without error.

In one embodiment of the present invention, the present effective current values are detected and integrated over a first time period. The first temperature gradient of the component is ascertained as a function of the determined integral. A method for determining the first temperature gradient is thus preferably provided as a function of the effective current flowing through the electric unit.

In one embodiment of the present invention, to determine the second temperature gradient, the temperature of the component is detected at the beginning and end of the first time period using the device for determining the temperature of a component, wherein deviations of the time points for detecting the temperature with respect to the beginning and end of the first time period of approximately 40% of the first time period are possible. Both gradients are thus advantageously detected as a function of an essentially simultaneous time period. Both gradients thus represent a comparable value, which corresponds to the change in the temperature of the unit and the component within this simultaneous time period. The more exact the time points at which the temperature of the component is detected and the beginning and end of the integral formation during the first time period agree, the more precisely the values of the two gradients agree. If the time points do not agree, then differing, that is erroneous, values of the two gradients may result, so that the diagnostic method as a whole becomes more inaccurate. A diagnostic method may have deviations in the time points for detecting the temperature with respect to the start and end of the first time period of approximately 40% of the first time period and still remain reliable.

In one embodiment of the present invention, in a method step temporally preceding the first step, the effective current flowing through the electric unit is set lower for a second time period than a first predefinable effective current value. The first predefinable effective current value is preselected to be small enough that during the second time period, the electric unit is not electrically loaded at all or only at a very low level. As a consequence, the temperatures at all points within the electric unit match the ambient temperature. It is thus advantageously possible to create a comparable starting point for the diagnosis of the device for determining the temperature of a component. It is therefore correspondingly advantageous if this method step temporally precedes the first step sufficiently closely or directly such that the temperatures at all points within the electric unit are still very close to each other at the beginning of the first step.

In one embodiment of the present invention, during the first step, the effective current flowing through the electric unit is set higher than a second predefinable effective current value. The second effective current value is preselected to be high enough that such an effective current within the first time period results in a significant temperature rise in the component of the electric unit. This means that the shorter the first time period is selected to be, the greater the second effective current value is predefined to be. It is thus advantageously achieved that because of the resulting significant temperature increases, correspondingly large temperature gradients occur, and the diagnostic method thus provides reliable results.

In one embodiment of the present invention, an erroneous determination of the temperature by the device for determining the temperature of a component is diagnosed if the magnitude of the difference between the first and the second temperature gradients exceeds a predefinable difference value. It may thus be concluded that a device for determining the temperature of a component functions if the difference between the two temperature gradients is smaller than the predefinable difference value. By selecting the predefinable allowed difference value, it is advantageously possible to set the error tolerance of the diagnostic method according to the type of electric unit, the component, or other ambient conditions.

In one embodiment of the present invention, the predefinable difference value is determined as a function of the ascertained first and/or second temperature gradient. For example, the difference value is 10 percent of a temperature gradient. Depending on the error tolerance of the applied diagnostic method, and depending on the type of electric unit, the component, or other ambient conditions, this value may advantageously be adapted to the specific system.

In another embodiment, the first temperature gradient is ascertained as a function of the determined integral using a characteristic map. Alternatively, the first temperature gradient is determined as a function of the determined integral using a mathematical model. To do this, the mathematical model takes into consideration, for example, thermal losses of the electric unit. It is thus advantageously possible to ascertain a value for a first temperature gradient from the calculated integral of the effective current flowing through the electric unit.

In another embodiment, the temperature of the component is ascertained using a temperature sensor on the electric unit. Any number of temperature sensors are known from the prior art that may be used to ascertain the temperature of the component. Alternatively, the temperature of the component is calculated using a temperature model of the unit. Simple systems for determining the two temperature values for determining the second temperature gradient are thus advantageously provided.

In one embodiment of the present invention, the unit is an electric machine and/or the component is the stator of the electric machine. However, the electric unit may also be any other units such as rectifiers, inverters, batteries, and other drives, through which an effective current flows during operation, causing them to be electrically loaded and heated. Accordingly, the component is also not limited to the stator of an electric machine, but to any components of the unit, such as rotors, circuit breakers, housings, electrodes, coils, and other components of the electric unit. This method is advantageously applicable to a plurality of electric units and their components.

Furthermore, an apparatus according to the present invention for diagnosing a device for determining a temperature of a component of an electric unit is provided, wherein an effective current flows through the electric unit during the operation of the electric unit. For this purpose, means are provided that ascertain a first temperature gradient of the component in a first step as a function of the effective current flowing through the electric unit. Furthermore, these means detect a second temperature gradient using the device for determining a component. In a second step, these means compare the two temperature gradients; in particular, they ascertain a difference between the first and the second temperature gradients.

An apparatus is thus advantageously provided that carries out two independent methods for determining two temperature gradients. A second step which constitutes the actual diagnostics is then carried out. The two temperatures gradients are compared. In particular, the difference between the first and the second temperature gradients is ascertained. If the difference between these two ascertained temperature gradients is smaller than a predefinable difference value, temperature detection using the device for determining the temperature of a component functions without error.

Furthermore, an electric system according to the present invention is provided. This electric system comprises an electronic power component and an electric unit and an apparatus for performing diagnostics. Depending on the embodiment and the application area, this electric system may comprise electronic power components such as batteries, intermediate circuits with intermediate-circuit capacitors, DC-DC converters, inverters, electric machines, and any type of DC sources, and an electric unit with the apparatus for diagnosing a device for determining the temperature of a component of an electric unit. Electric systems are thus advantageously provided, which provide a diagnosis for monitoring a device for determining the temperature of a component of an electric unit.

It is to be understood that the features, properties, and advantages of the method according to the present invention correspondingly apply or are applicable to the apparatus according to the present invention and conversely to the electric system.

BRIEF DESCRIPTION OF THE DRAWINGS

Additional features and advantages of embodiments of the present invention result from the following description with reference to the included drawings.

DETAILED DESCRIPTION

Figure 1:
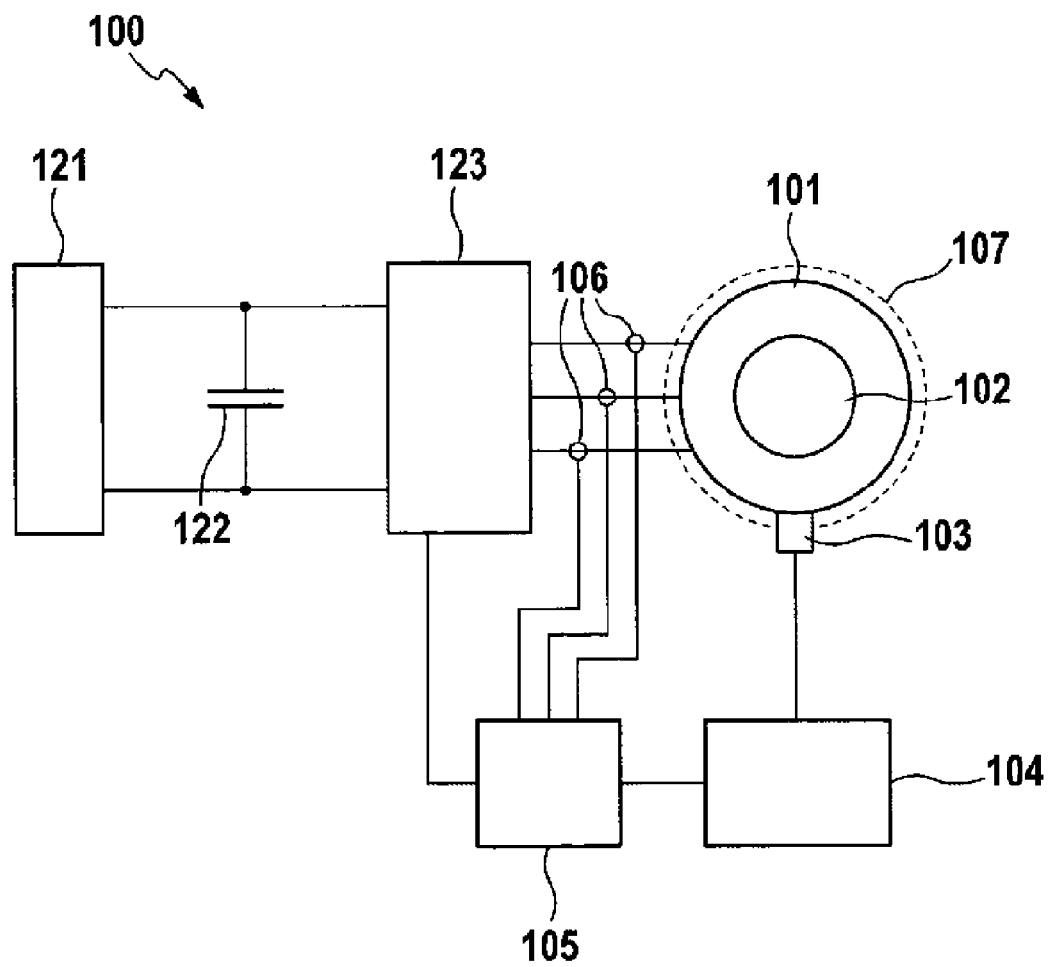
FIG. 1 shows an electric system according to the present invention in schematic form

In the figures, identical and functionally identical elements, features, and components are provided with the same reference numbers, unless stated otherwise. It is to be understood that for reasons of clarity, components and elements in the drawings are not necessarily depicted true to scale.

Additional possible embodiments and refinements and implementations of the present invention also include combinations of features of the invention described above or below that are not explicitly specified.

FIG. 1 shows an electric system 100. The electric system 100 includes a pulse-width-modulation inverter as an electronic power component 123. This pulse-width-modulation inverter is used for supplying and controlling an electric unit 107. In this embodiment, the electric unit 107 is an electric machine with a rotor 102 and a stator 101. Furthermore, a device 104 for determining the temperature of a component 101 is provided. The temperature sensor 103 measures the temperature of the stator 101 and provides a measurement signal to the device 104 for determining the temperature. Furthermore, an apparatus 105 for diagnosing the device 104 is provided. The apparatus 105 is connected to current sensors 106, which detect the electric current flowing through the electric unit 107. The effective current E flowing through the electric unit is ascertained in the apparatus 105 from the detected electric current using known algorithms. Furthermore, the apparatus 105 is connected to the pulse-width-modulation inverter 123 in order to specify limits when controlling the electric unit 107, so that the required boundaries of the effective current E are maintained during the method for diagnosing the device 104. Furthermore, the electric system 100 includes additional electronic power components such as the battery 121 and the intermediate circuit with the intermediate-circuit capacitor 122. As mentioned above, the electric system 100 according to the present invention is not limited to this embodiment. In particular, the apparatus 105 for diagnosing the device 104 may be used to determine the temperature of any component 101 of an electric unit 107 arranged in any way, for example, a pulse-width-modulation inverter 123, battery 121, intermediate-circuit capacitor 122, or an entirely different unit for determining the temperature of any of its components 101.

Figure 2:
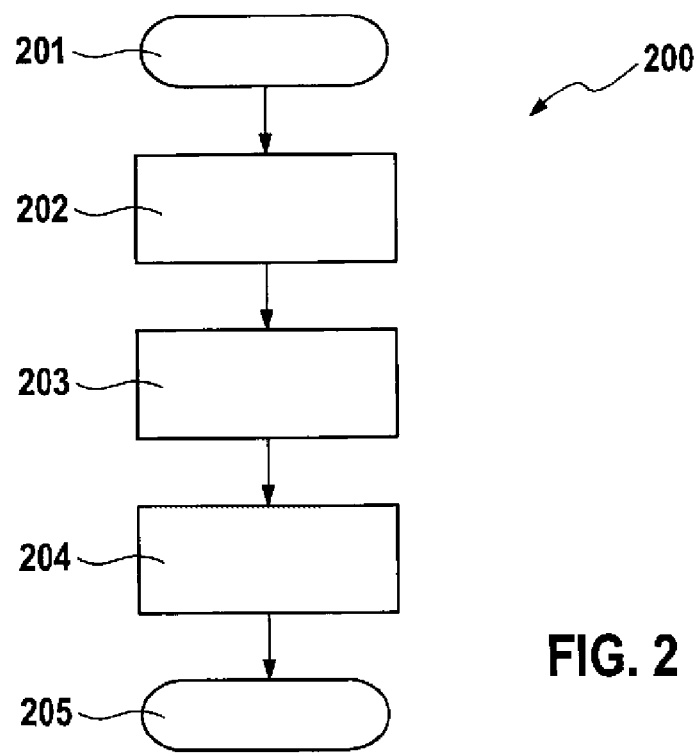
FIG. 2 shows a method for diagnosing a device for determining the temperature of a component of an electric unit in schematic form

FIG. 2 shows the method 200 for diagnosing a device 104 for determining the temperature of a component 101 of an electric unit 107. The method starts at step 201. In the following method step 202, the electric system 100 is controlled such that the effective current E flowing through the electric unit 107 is smaller than a first predefinable effective current value E1 for a second period of time T2. This step is used in particular for matching the temperatures within the unit 107 to the ambient temperature. If the unit 107 is, for example, an electric machine, it must in particular be ensured that its rotational speed remains lower than a predefinable value, so that the induced voltage does not cause an undesirably high effective current E, which in turn causes a temperature increase in the electric machine. In a first step 203 immediately following the method step 202, the electric system 100 is controlled in such a way that during a first time period T1, the present effective current values E are detected and integrated, and a first temperature gradient T1 of the component 101 is ascertained as a function of the determined integral. At the start and end of the first time period T1, the temperature STE1, STE2 of the component is detected using the device 104 for determining the temperature of a component 101, and a second temperature gradient TG2 is determined from these two values by forming a difference. In the following step 204, the difference between the first and second temperature gradients TG1, TG2 is ascertained. If the magnitude of the difference exceeds a predefinable difference value, a faulty device 104 for determining the temperature of a component 101 is diagnosed. The method ends at step 205.

Figure 3:
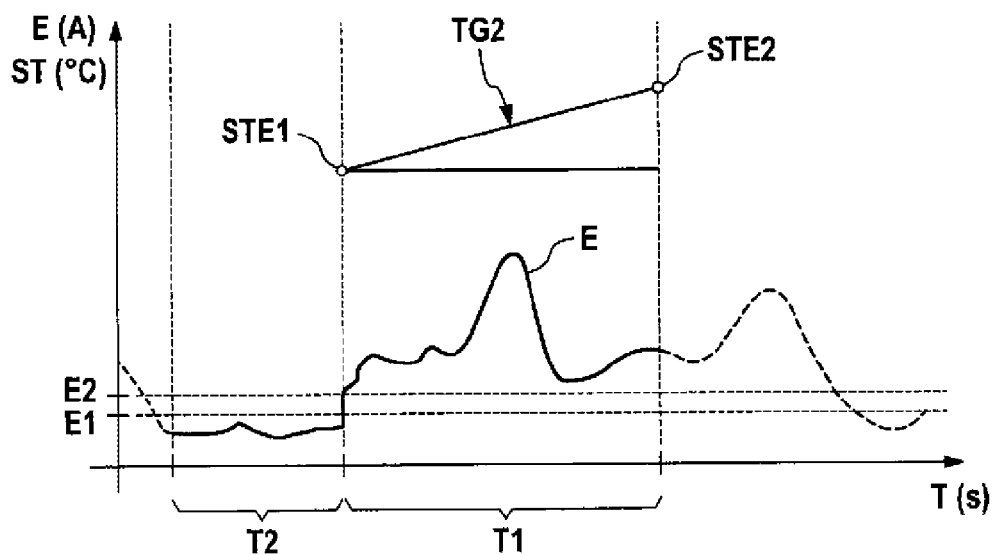
FIG. 3 shows a waveform of an effective current over time in a diagram.

FIG. 3 shows a diagram in schematic form in which an effective current waveform E is depicted over time T. During the time period T2, it is observed that the values of the effective current E lie below the predefinable effective current value E1. Within the time period T1, it is observed that the values of the effective current E lie above the second predefinable effective current value E2. This current waveform enables performing the diagnosis with a reliable result. Furthermore, in the diagram, the two temperature measurement points are depicted at the start and end of the first time period T1. The temperature gradient TG2 is ascertained from the difference between the temperature values STE1 and STE2. The greater the difference between STE2 and STE1 is, the greater the value of the temperature gradient TG2 will be.

The invention claimed is:

1. A method (200) for diagnosing a device (104) for determining the temperature of a component (101) of an electric unit (107), wherein an effective current (E) flows through the electric unit (107) during the operation of the electric unit (107), characterized in that:

in a first step (203), a first temperature gradient (TG1) of the component (101) is ascertained as a function of the effective current (E) flowing through the electric unit (107), and a second temperature gradient (TG2) is determined using the device (104) for determining the temperature of the component (101), and in a second step (204), a difference between the first and the second temperature gradients (TG1, TG2) is ascertained.

2. The method according to claim 1, characterized in that the first temperature gradient (TG1) of the component (101) is ascertained by detecting and integrating the current effective current values (E) over a first time period (T1), and ascertaining the first temperature gradient (TG1) of the component (101) as a function of the determined integral.

3. The method according to claim 2, characterized in that the second temperature gradient (TG2) is determined by detecting the temperature (STE1, STE2) of the component using the device (104) for determining the temperature of the component (101) at the beginning and end of the first time period (T1), wherein deviations of the time points for detecting the temperature (STE1, STE2) with respect to the beginning and end of the first time period (T1) of approximately 40% of the first time period (T1) are possible.

4. The method according to claim 1, characterized in that in a method step (202) temporally preceding the first step (203), the effective current (E) flowing through the electric unit (107) is lower for a second time period (T2) than a predefinable first effective current value (E1).

5. The method according to claim 1, characterized in that during the first step (203), the effective current (E) flowing through the electric unit (107) is higher than a predefinable second effective current value (E2).

6. The method according to claim 1, characterized in that an erroneous determination of the temperature by the device (104) for determining the temperature of a component (101) is diagnosed if the magnitude of the difference between the first and the second temperature gradients (TG1, TG2) exceeds a predefinable difference value.

7. The method according to claim 6, characterized in that the predefinable difference value is determined as a function of the ascertained first and second temperature gradient (TG1, TG2).

8. The method according to claim 6, characterized in that the predefinable difference value is determined as a function of the ascertained first temperature gradient (TG1).

9. The method according to claim 6, characterized in that the predefinable difference value is determined as a function of the ascertained second temperature gradient (TG2).

10. The method according to claim 2, characterized in that the first temperature gradient (TG1) is ascertained as a function of the determined integral using a characteristic map.

11. The method according to claim 3, characterized in that the temperature (STE1, STE2) of the component (101) is ascertained using a temperature sensor (103) on the electric unit.

12. The method according to claim 1, characterized in that the unit (107) is an electric machine.

13. The method according to claim 12, characterized in that the component (101) is a stator of the electric machine (107).

14. The method according to claim 1, characterized in that the component (101) is a stator of an electric machine.

15. An apparatus (105) for diagnosing a device (104) for determining the temperature of a component (101) of an electric unit (107), wherein an effective current (E) flows through the electric unit (107) during the operation of the electric unit (107), characterized in that in a first step (203), the apparatus (105) ascertains a first temperature gradient (TG1) of the component (101) as a function of the effective current (E) flowing through the electric unit, and wherein the apparatus (105) or the device (104) determines a second temperature gradient (TG2) using the device (104) for determining the temperature of the component (101), and in a second step (204), the apparatus (105) ascertains a difference between the first and the second temperature gradients (TG1, TG2).

16. An electric system (100), comprising at least one electronic power component (123) and one electric unit (107) and one apparatus (105) for performing diagnostics according to claim 15.

* * * * *